(12) United States Patent
Searls et al.

(10) Patent No.: US 6,730,860 B2
(45) Date of Patent: May 4, 2004

(54) ELECTRONIC ASSEMBLY AND A METHOD OF CONSTRUCTING AN ELECTRONIC ASSEMBLY

(75) Inventors: Damion T. Searls, Hillsboro, OR (US); Terrance J. Dishongh, Hillsboro, OR (US); James D. Jackson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/952,653

(22) Filed: Sep. 13, 2001

(65) Prior Publication Data

US 2003/0047356 A1 Mar. 13, 2003

(51) Int. Cl.⁷ .................... H05K 1/11; H01R 12/03
(52) U.S. Cl. ............... 174/262; 174/260; 174/261; 174/266; 361/760; 361/777; 361/794; 257/778; 257/738
(58) Field of Search ................. 174/262, 266, 174/260, 261, 255; 361/760, 792, 795, 794, 777, 783; 257/778, 774, 698, 738

(56) References Cited

U.S. PATENT DOCUMENTS

| | | | |
|---|---|---|---|
| 4,861,941 A | | 8/1989 | Kubo et al. |
| 5,088,007 A | * | 2/1992 | Missele ............... 361/704 |
| 5,686,699 A | * | 11/1997 | Chu et al. ............ 174/52.4 |
| 5,786,630 A | * | 7/1998 | Bhansali et al. ....... 257/697 |
| 5,842,877 A | | 12/1998 | Mångrtensson et al. |
| 5,847,936 A | * | 12/1998 | Forehand et al. ...... 361/794 |
| 5,973,929 A | | 10/1999 | Arakawa et al. |
| 6,064,113 A | * | 5/2000 | Kirkman ............... 257/691 |
| 6,191,475 B1 | * | 2/2001 | Skinner et al. ........ 257/700 |
| 6,198,635 B1 | * | 3/2001 | Shenoy et al. ........ 361/760 |
| 6,346,679 B1 | * | 2/2002 | Nakamura ............ 174/260 |
| 6,388,890 B1 | * | 5/2002 | Kwong et al. ........ 361/780 |
| 6,448,639 B1 | * | 9/2002 | Ma ..................... 257/691 |
| 6,449,169 B1 | * | 9/2002 | Ho et al. .............. 361/762 |
| 6,479,758 B1 | * | 11/2002 | Arima et al. .......... 174/260 |

FOREIGN PATENT DOCUMENTS

| | | |
|---|---|---|
| DE | 197 48 689 A1 | 5/1999 |
| GB | 2 358 735 A | 8/2001 |
| JP | 08236 655 | 9/1996 |
| JP | 08288 626 | 11/1996 |
| JP | 10056 093 | 2/1998 |

* cited by examiner

Primary Examiner—Kamand Cuneo
Assistant Examiner—I B Patel
(74) Attorney, Agent, or Firm—Blakely, Sokoloff, Taylor & Zafman LLP

(57) ABSTRACT

Solder bumps are created on a substrate of an electronic assembly having lengths that are longer than the widths. The solder bumps are created by locating solder balls of power or ground connections close to one another so that, upon reflow, the solder balls combine. Signal solder balls however remain separated. Capacitors are created by locating power solder bumps adjacent ground solder bumps and extending parallel to one another.

12 Claims, 3 Drawing Sheets

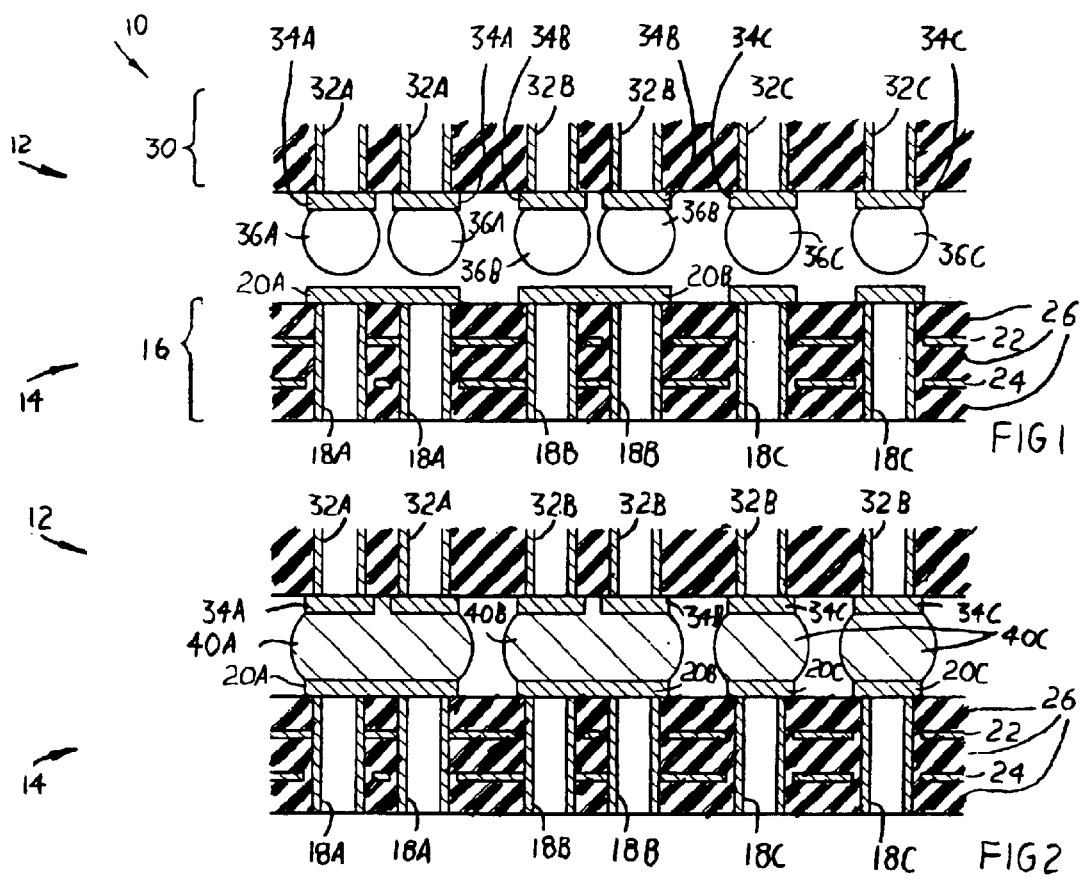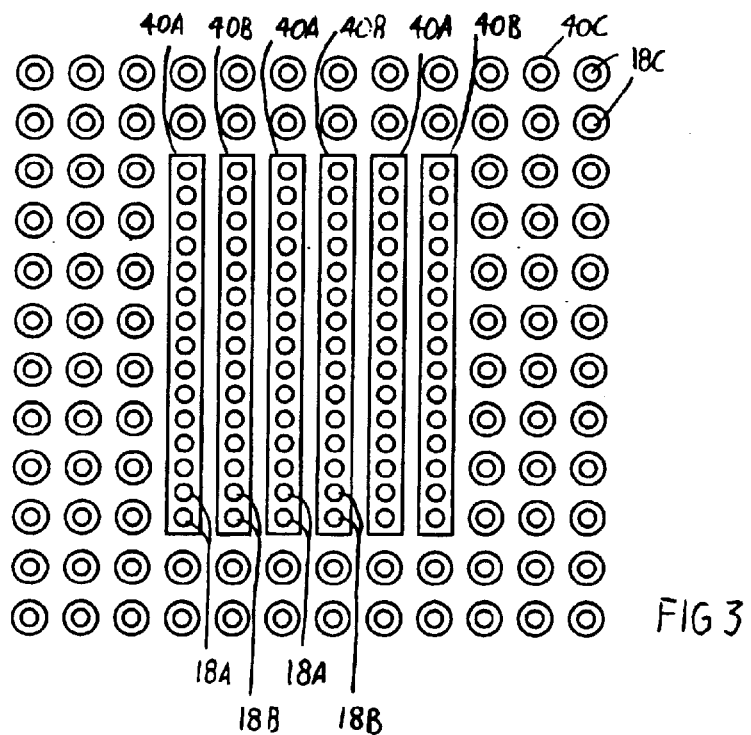

ELECTRONIC ASSEMBLY AND A METHOD OF CONSTRUCTING AN ELECTRONIC ASSEMBLY

BACKGROUND OF THE INVENTION

1). Field of the Invention

This invention relates generally to an electronic assembly, typically of the kind having a package substrate secured to a printed circuit board utilizing solder bumps.

2). Discussion of Related Art

Integrated circuits are often manufactured in and on semiconductor wafers which are subsequently cut into individual semiconductor chips. A chip is then mounted to a package substrate and electrically connected thereto. The package substrate is then mounted to a printed circuit board.

Solder balls are usually located on the surface of the package substrate which is located against the printed circuit board. The combination is then heated and allowed to cool so that the solder balls form solder bumps which secure the package substrate structurally to the printed circuit board, in addition to electrically connecting the package substrate to the printed circuit board.

Electronic signals can be provided through the solder bumps between the printed circuit board and the integrated circuit. Other ones of the solder bumps provide power and ground to the integrated circuit. It may occur that high currents flow through some of the solder bumps, in particular those providing power or ground to the integrated circuit. These high currents may cause damage to the solder bumps. The solder bumps providing power, ground and signal communication are also usually equally spaced from one another thus taking up similar amounts of space.

BRIEF DESCRIPTION OF THE DRAWINGS

The invention is described by way of examples with reference to the accompanying drawings wherein:

FIG. 1 is a cross-sectional side view illustrating components of an electronic assembly according to an embodiment of the invention;

FIG. 2 is a view similar to FIG. 1 after the components are brought together, heated and allowed to cool;

FIG. 3 is a plan view illustrating the layout of solder bumps and vias of a printed circuit board of the electronic assembly;

DETAILED DESCRIPTION OF THE INVENTION

Figure 4:
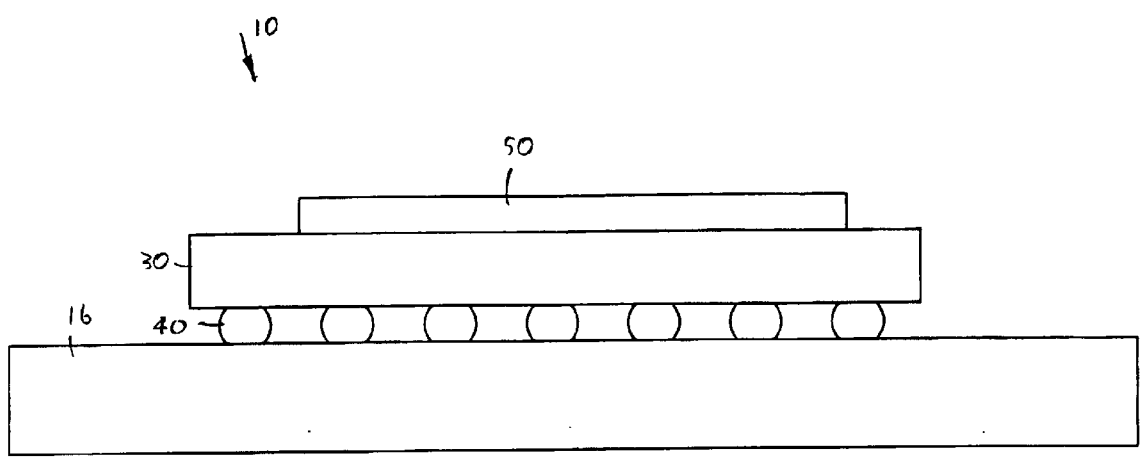
FIG. 4 is a side view illustrating more components of the electronic assembly.

FIG. 1 of the accompanying drawings illustrates components of an electronic assembly 10 before being secured to one another. The electronic assembly 10 includes a package substrate subassembly 12 and a printed circuit board subassembly 14.

The printed circuit board subassembly 14 includes a printed circuit board 16, vias 18, and contact pads 20.

The printed circuit board 16 includes a number of layers including a power plane 22, a ground plane 24, and other layers 26. The power plane 22 is separated from a ground plane 24 by one of the layers 26. Another one of the layers 26 is located on top of the power plane 22 and a further one of the layers 26 is located on a lower surface of the ground plane 24. The power and ground planes 20 and 24 are thus separated from one another by one of the layers 26 and spaced from upper and lower surfaces of the printed circuit board 16 by other ones of the layers 26.

The vias 18 are located in the printed circuit board 16 and extend from the upper surface thereof to the lower surface thereof through the layers 22, 24, and 26. The vias 18 include power vias 18A, ground vias 18B and signal vias 18C. The power vias 18A have lower ends connected to the power plane 22. The ground vias 18B have lower ends connected to the ground plane 24. The signal vias 18C are disconnected from the power and ground planes 22 and 24.

The contact pads 20 include a power contact pad 20A, a ground contact pad 20B and signal contact pads 20C. The power contact pad 20A has a height measured in a direction from the bottom of the paper to the top of the paper, a width as measured into the paper, and a length as measured from the left to the right of the paper. The length is a multiple of the width. The power contact pad 20A is located on all the power vias 18A. Each one of the power vias 18A is attached and connected to the power contact pad 20A at a respective location along the length of the power contact pad 20A. As such, the power vias 18A connect the power contact pad 20A in parallel to the power plane 22. In another embodiment the vias may be located outside the contact pads in an arrangement commonly referred to as a "dogbone" configuration.

The ground contact pad 20B, similarly, has a height, a width, and a length which is a multiple of the width. The ground contact pad 20B is located on all the ground vias 18B so that each ground via 18B has a respective upper end connected to the ground contact pad 20B at a respective location along its length. Each signal contact pad 20C is located on and connected to a respective one of the signal vias 18C. Each signal contact pad 20C is disconnected from every other contact pad 20.

The package substrate subassembly 12 includes a package substrate 30, vias 32, bond pads 34, and solder balls 36. The package substrate 30 is also a multi-layer substrate having a ground plane and a power plane. The vias include power vias 32A, ground vias 32B, and signal vias 32C. Each one of the power vias 32A has an upper end connected to a ground plane in the package substrate 30 and each one of the ground vias 32B has an upper end connected to a ground plane in the package substrate 30.

The bond pads 34 include the power bond pads 34A, ground bond pads 34B, and signal bond pads 34C, all located on a lower surface of the package substrate 30. Each power bond pad 34A is located on a respective lower end of a respective one of the power vias 32A, each ground bond pad 34B is located on a respective lower end of a respective ground via 32B, and each signal bond pad 34C is located on a respective lower end of a respective signal via 32C.

The solder balls 36 include power solder balls 36A, ground solder balls 36B, and signal solder balls 36C. Each power solder ball 36A is located on a respective lower surface of a respective one of the power bond pads 34A, each ground solder ball 36B is located on a respective lower surface of a respective ground bond pad 34B, and each signal solder ball 36C is located on a respective lower surface of respective signal bond pads 34C.

Each respective power via 32A is aligned with one power bond pad 34A, one power solder ball 36A, and one power via 18A. Center points of the power solder balls 36A are spaced from one another by about 1 mm. A center point of the power solder ball 36A on the right is spaced from a center point of the ground solder ball 36B on the left by about 1.2 mm. Center points of the ground solder balls 36B are spaced from one another by about 1 mm. A center point of the ground solder ball 36B on the right is spaced from a center point of the signal solder ball 36C on the left by about 1.2 mm. Center points of the signal solder balls 36C are spaced from one another by about 1.2 mm. All the solder balls 36A, B, and C have equal mass and size. Therefore, the combined mass of the power solder balls 36A divided by the number of power vias 18A equals the combined mass of the ground solder balls 36B divided by the number of ground vias 18B, and equals the combined mass of the signal solder balls 36C divided by the number of signal vias 18C.

The package substrate subassembly 12 is lowered onto the printed circuit board subassembly 14 so that lower surfaces of the solder balls 36 contact upper surfaces of the contact pads 18A. All the power solder balls 36A contact the power contact pad 20A, all the ground solder balls 36B contact the ground contact pad 20B, and each signal solder ball 36C contacts a respective one of the signal contact pads 20C.

The combination of the package substrate assembly 12 and the printed circuit board subassembly 14 is then located in a reflow furnace. The solder balls 36 are heated to above their melting temperature so that they melt. The power solder balls 36A combine when they melt due to their relative close spacing and the ground solder balls 36B combine when they melt due to their relative close spacing. The power solder balls 36A however do not combine with the ground solder balls 36B. The signal solder balls 36C remain disconnected from one another from the ground solder balls 36B and from the power solder balls 36A.

The combination of the package substrate subassembly 12 and the printed circuit board subassembly 14 is then removed from the reflow furnace and allowed to cool so that the material of the melted solder balls again solidifies. The solidified material of the power solder balls 36A is represented in FIG. 2 as a power solder bumps 404, the combination of the ground solder balls 36B is represented as a ground solder bump 40B, and the melted and reflowed signal solder balls 36C is represented by signal solder bumps 40C.

Each one of the power solder bumps 40A has a height, a width, and a length with the width and length of the power solder bump 40A correspond to the width and the length of the power contact pad 20A. Similarly, the ground solder bump 40B has a height, a width, and a length, the width and length corresponding to the width and length of the ground contact pad 20B. As such, the power solder bump 40B has a length which is a multiple of its width and the ground solder bump 40B has a length which is a multiple of its width.

Upper ends of the power vias 18A are connected through the power contact pads 20A to respective points of the power solder bump 40A along its length and upper ends of the ground vias 18B are connected to the ground contact pad 20B to the ground solder bump 40B at respective locations along its length. The power solder bump 40A is thus connected in parallel through the power vias 18A to the power plane 22 and the ground solder bump is connected in parallel through the ground vias 18B to the ground plane 24.

An advantage of combining the power solder balls 36A and combining the ground solder balls 36B is that they can be located closer to one another. More space is so freed up for additional ones of the signal solder balls 36C. Another advantage of combining the power solder balls 36A and combining the ground solder balls 36B is that potential high currents through individual ones of the balls 36A or B can be distributed through the larger solder bumps 40A or 40B.

FIG. 3 is a more accurate representation of the relative positioning of the power and ground solder bumps 40A and 40B. The power and solder bumps 40A and 40B are represented by rectangles. The signal solder bumps 40C are represented by larger circles. The power ground and signal vias 18A, 18B, and 18C are represented by the smaller circles.

It can be seen that the power and ground solder bumps 40A and 40B are located in lines parallel to one another, directly adjacent one another with a respective ground solder bump 40B located between two of the power solder bumps 40A. A surface of one of the power solder bumps 40A thus faces a respective surface of one of the ground solder bumps 40B to form a plurality of capacitors. In the example illustrated, there are three power solder bumps 40A and three ground solder bumps 40D and five capacitors are created. The capacitors assist in reducing resistive and inductive time delay of power or ground signals. All the power and ground vias 18A and 18B are located over a rectangular area where there are none of the signal vias 18C and all the signal vias are located around the rectangular area where all the power and ground vias 18A and 18B are located.

FIG. 4 illustrates more components of the electronic assembly. In addition to the package substrate 30 and the printed circuit board 16, the electronic assembly 10 further includes a semiconductor chip 50. The semiconductor chip 50 has an integrated circuit of electronic components therein. The semiconductor chip 50 is mounted on the package substrate 30 and electrically connected thereto. Electronic signals can be provided to and from the integrated circuit in the semiconductor die 50 and the printed circuit board 16 through the solder bumps 40 and the package substrate 30.

Figure 5:
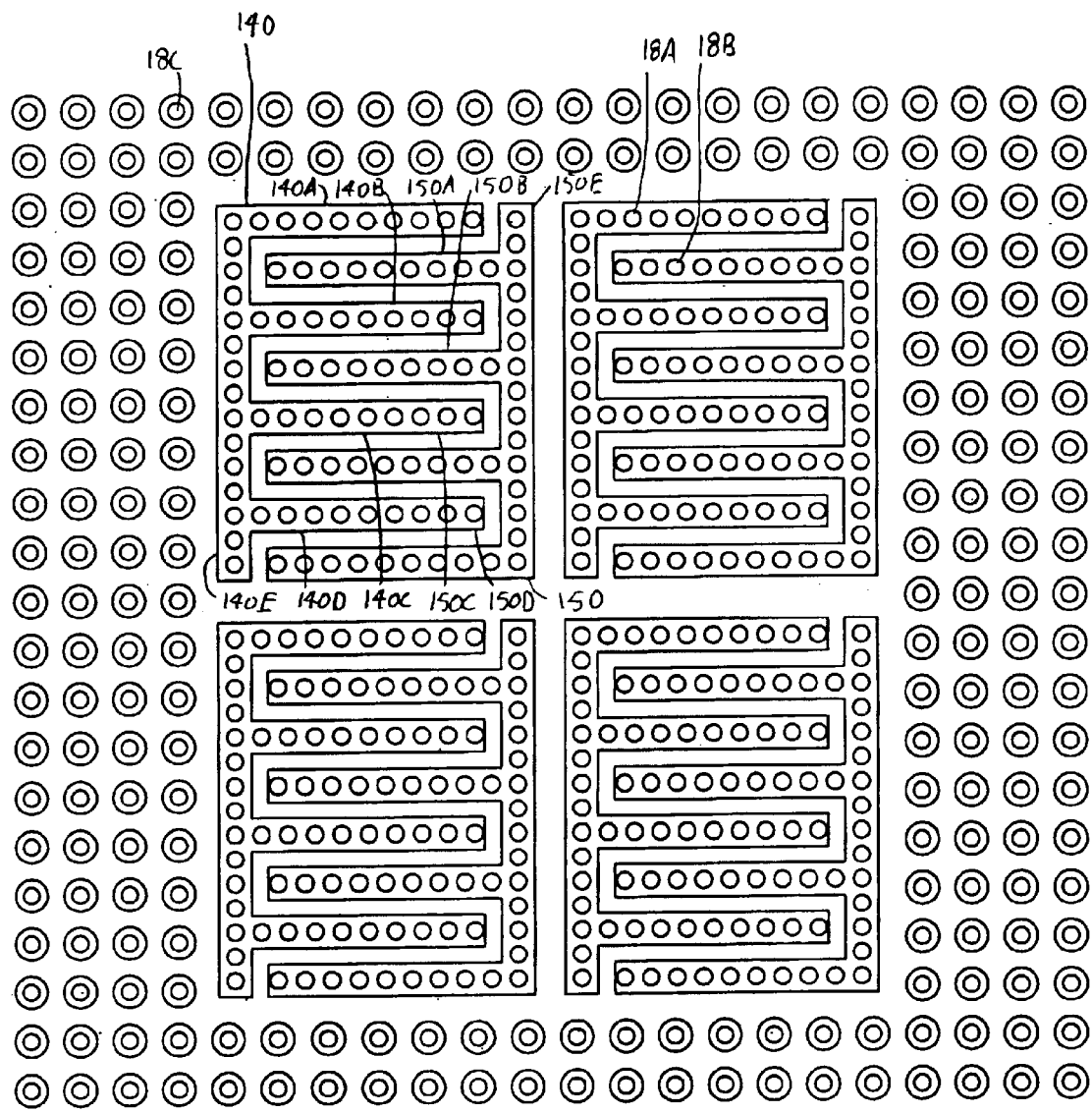
FIG. 5 is a plan view of a printed circuit board according to another embodiment of the invention.

FIG. 5 illustrates another manner in which capacitors can be created with power and ground solder bumps. Similar reference numerals are used as in the embodiment of FIG. 3. A power solder bump 140 has a plurality of limbs 140A–E. The limbs 140A–D all lead off the limb 140E. A ground bump 150 is provided having limbs 150A–E. The limbs 150A–D lead off the limb 150E. The limbs 150A–D are located between the limbs 140A–D so that the limbs 140 are alternated by the limbs 150A–D. It has been found that a larger capacitor can be created over a given surface area by "fanning" the limbs into one another as illustrated in FIG. 5.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. An electronic assembly comprising:
   a substrate having a plurality of layers, at least one of which is a power plane;
   a plurality of power vias in the substrate, having respective lower ends connected to the power plane at respective spaced apart locations, and respective upper ends;
   a power solder bump on an upper surface of the substrate having a height, a width and a length, the length being a multiple of the width, the upper ends of the power solder vias being connected to the power solder bump at respective spaced apart locations along the length of the power solder bump, so that the power solder vias connect the power solder bump in parallel to the power plane;

a plurality of ground vias in the substrate having respective lower ends connected to the ground plane at respective spaced apart locations, and respective upper ends: and a ground solder bump on the upper surface of the substrate having a height a width and a length the length being a multiple of the width the upper ends of the ground solder vias being connected to the ground solder bump at respective spaced apart locations along the length of the ground solder bump so that the ground solder vias connect the ground solder bump in parallel to the ground plane, wherein the power and ground solder bumps are located directly adjacent one another, their lengths extending substantially parallel to one another so as to have surfaces facing one another to form a capacitor.

2. The electronic assembly of claim 1 further comprising:

a power contact pad on the upper surface of the substrate, the power vias being connected to the contact pad and the power solder bump being located on the power contact pad.

3. The electronic assembly of claim 1 further comprising:

a ground contact pad on the upper surface of the substrate, the ground vias being connected to the ground contact pad and the ground solder bump being located on the ground contact pad.

4. The electronic assembly of claim 1 comprising a plurality of power bumps and ground bumps alternating one another to form a plurality of capacitors.

5. The electronic assembly of claim 1 further comprising:

a plurality of signal vias in the substrate; and a plurality of signal solder bumps, on the upper surface of the substrate, each connected to a separate one of the signal vias.

6. The electronic assembly of claim 5 wherein the power vias are denser than the signal vias.

7. The electronic assembly of claim 1 wherein the mass of one power solder bump divided by the total number of power vias connected thereto substantially equals the mass of one signal solder bump.

8. The electronic assembly of claim 1 wherein the substrate is a printed circuit board.

9. The electronic assembly of claim further comprising:

a package substrate;

a plurality of power bond pads on a lower surface of the package substrate, the power bond pads being connected to the power solder bump; and a plurality of power vias in the package substrate each having an end connected to a respective one of the power bond pads.

10. The electronic assembly of claim 9 wherein each power via in the package substrate is aligned with a respective power via in the printed circuit board.

11. An electronic assembly comprising:

a substrate having a plurality of layers, one of which is a power plane and one of which is a separate ground plane;

a plurality of power vias in the substrate, having respective lower ends connected to the power plane at respective spaced apart locations, and respective upper ends;

a power solder bump on an upper surface of the substrate having a height, a width and a length, the length being a multiple of the width, the upper ends of the power solder vias being connected to the power solder bump at respective spaced apart locations along the length of the power solder bump, so that the power solder vias connect the power solder bump in parallel to the power plane;

a plurality of ground vias in the substrate, having respective lower ends connected to the ground plane at respective spaced apart locations, and respective upper ends;

a ground solder bump on the upper surface of the substrate having a height, a width and a length, the length being a multiple of the width, the upper ends of the ground solder vias being connected to the ground solder bump at respective spaced apart locations along the length of the ground solder bump, so that the ground solder vias connect the ground solder bump in parallel to the ground plane wherein the power and ground solder bumps are located directly adjacent one another, their lengths extending substantially parallel to one another so as to have surfaces facing one another to form a capacitor:

a plurality of signal vias in the substrate; and a plurality of signal solder bumps, on the upper surface of the substrate, each connected to a separate one of the signal vias.

12. The electronic assembly of claim 11 further comprising:

a power contact pad on the upper surface of the substrate, the power vias being connected to the contact pad and the power solder bump being located on the power contact pad.

* * * * *

UNITED STATES PATENT AND TRADEMARK OFFICE
CERTIFICATE OF CORRECTION

PATENT NO. : 6,730,860 B2  Page 1 of 1
DATED : May 4, 2004
INVENTOR(S) : Searls et al.

It is certified that error appears in the above-identified patent and that said Letters Patent is hereby corrected as shown below:

Column 3,
Line 38, delete "404" and insert -- 40A --.

Column 5,
Line 6, after the first occurrence of "length", insert -- , --.
Line 7, after "width", insert -- , --.

Signed and Sealed this

Fourth Day of January, 2005

JON W. DUDAS
*Director of the United States Patent and Trademark Office*